(12) United States Patent
Waschura et al.

(10) Patent No.: US 9,025,652 B2
(45) Date of Patent: *May 5, 2015

(54) VARIABLE INTER SYMBOL INTERFERENCE GENERATOR

(75) Inventors: Thomas E. Waschura, Portola Valley, CA (US); Stephen N. Reinhold, Los Gatos, CA (US)

(73) Assignee: Tektronix, Inc., Beaverton, OR (US)

( * ) Notice: Subject to any disclaimer, the term of this patent is extended or adjusted under 35 U.S.C. 154(b) by 250 days.

This patent is subject to a terminal disclaimer.

(21) Appl. No.: 13/219,152

(22) Filed: Aug. 26, 2011

(65) Prior Publication Data

US 2012/0201324 A1    Aug. 9, 2012

Related U.S. Application Data

(60) Provisional application No. 61/439,764, filed on Feb. 4, 2011.

(51) Int. Cl.
*H04L 1/24* (2006.01)
*H04L 25/03* (2006.01)
*G01R 31/317* (2006.01)

(52) U.S. Cl.
CPC ............ *H04L 1/24* (2013.01); *H04L 25/03885* (2013.01); *H04L 2025/03471* (2013.01); *H04L 2025/03579* (2013.01); *G01R 31/31709* (2013.01)

(58) Field of Classification Search
CPC ... H04L 27/01; H04L 25/0264; H04L 25/028; H04L 43/50; H04L 69/323; G01R 31/31709
USPC ......... 375/295, 296, 316, 346, 348, 350, 229, 375/230, 232, 259, 285, 224; 455/39, 42, 455/43, 91, 114.2, 114.3; 386/263, 264, 386/269; 708/100, 200, 300, 322, 323
See application file for complete search history.

(56) References Cited

U.S. PATENT DOCUMENTS

| | | | | |
|---|---|---|---|---|
| 7,440,497 | B2 * | 10/2008 | Balan et al. | 375/229 |
| 7,693,691 | B1 * | 4/2010 | Tao et al. | 703/2 |
| 2005/0134163 | A1 * | 6/2005 | Voorhees et al. | 313/407 |
| 2008/0228426 | A1 | 9/2008 | Calvin et al. | |
| 2009/0119554 | A1 * | 5/2009 | Dai et al. | 714/717 |
| 2009/0195498 | A1 | 8/2009 | Karapattu et al. | |
| 2009/0195525 | A1 * | 8/2009 | Karapattu et al. | 345/208 |
| 2012/0072784 | A1 * | 3/2012 | Li et al. | 714/704 |

OTHER PUBLICATIONS

Extended European Search Report for European Patent Application No. 12154072.8, dated Oct. 31, 2014, 7 pages, The Hague.

* cited by examiner

*Primary Examiner* — Vineeta Panwalkar
(74) *Attorney, Agent, or Firm* — Michael A. Nelson; Marger Johnson & McCollom PC

(57) ABSTRACT

Embodiments of the present invention provide a variable inter symbol interference generator that generates a data signal having a variable amount of inter symbol interference by passing a data signal through (1) a programmable filter having an adjustable frequency response, and through (2) a fixed filter having a fixed frequency response such as a PCB trace, a length of cable, a discrete filter, or the like. By adjusting the parameters and therefore the insertion gain or loss of the programmable filter, a large range of continuously variable and finely-tunable inter symbol interference amounts can be easily generated.

23 Claims, 11 Drawing Sheets

_US 9,025,652 B2_

VARIABLE INTER SYMBOL INTERFERENCE GENERATOR

CROSS-REFERENCE TO RELATED APPLICATIONS

This application claims the benefit of U.S. Provisional Patent Application No. 61/439,764 titled "VARIABLE INTER SYMBOL INTERFERENCE GENERATOR" filed on Feb. 4, 2011 which is herein incorporated by reference.

FIELD OF THE INVENTION

The present invention relates to test and measurement instruments, and more particularly to the generation of test signals with impairments.

BACKGROUND OF THE INVENTION

Many test systems need to add inter symbol interference (ISI) as a stress source when testing serial digital receivers. This is done to emulate real-life situations where long cables and/or printed circuit board (PCB) traces add ISI into a communications link. Once added, the receiver is challenged to operate in error-free conditions despite the added impairing stress. Grading mechanisms for receivers amount to seeing how much ISI a given receiver can operate error-free with. For this reason, creating a continuously variable amount of ISI in a test system is desirable.

Continuously variable ISI has been elusive as the current state of the art employs RF switches to switch-in different lengths of PCB traces which causes a practical limitation to the number of trace-length paths that can be inserted. This decreases the resolution of the varying increments of ISI. Alternatively, a large collection of fixed PCB traces can be used and manually cabled; however, this presents a problem for automatically changing between one amount of ISI stress and another.

What is needed is a variable ISI generator.

SUMMARY OF THE INVENTION

Embodiments of the present invention provide a variable inter symbol interference generator that generates a data signal having a variable amount of inter symbol interference by passing a data signal through (1) a programmable filter having an adjustable frequency response, and through (2) a fixed filter having a fixed frequency response such as a PCB trace, a length of cable, a discrete filter, or the like. By adjusting the parameters and therefore the insertion gain or loss of the programmable filter, a large range of continuously variable and finely-tunable inter symbol interference amounts can be easily generated.

The objects, advantages, and other novel features of the present invention are apparent from the following detailed description when read in conjunction with the appended claims and attached drawings.

DETAILED DESCRIPTION OF THE INVENTION

Embodiments of the present invention provide a variable ISI generator that generates a data signal having variable amounts of ISI by passing a data signal through (1) an emphasis or de-emphasis filter having an adjustable frequency response, and through (2) a fixed filter having a fixed frequency response such as a PCB trace, a length of cable, a discrete filter, or the like.

Figure 1:
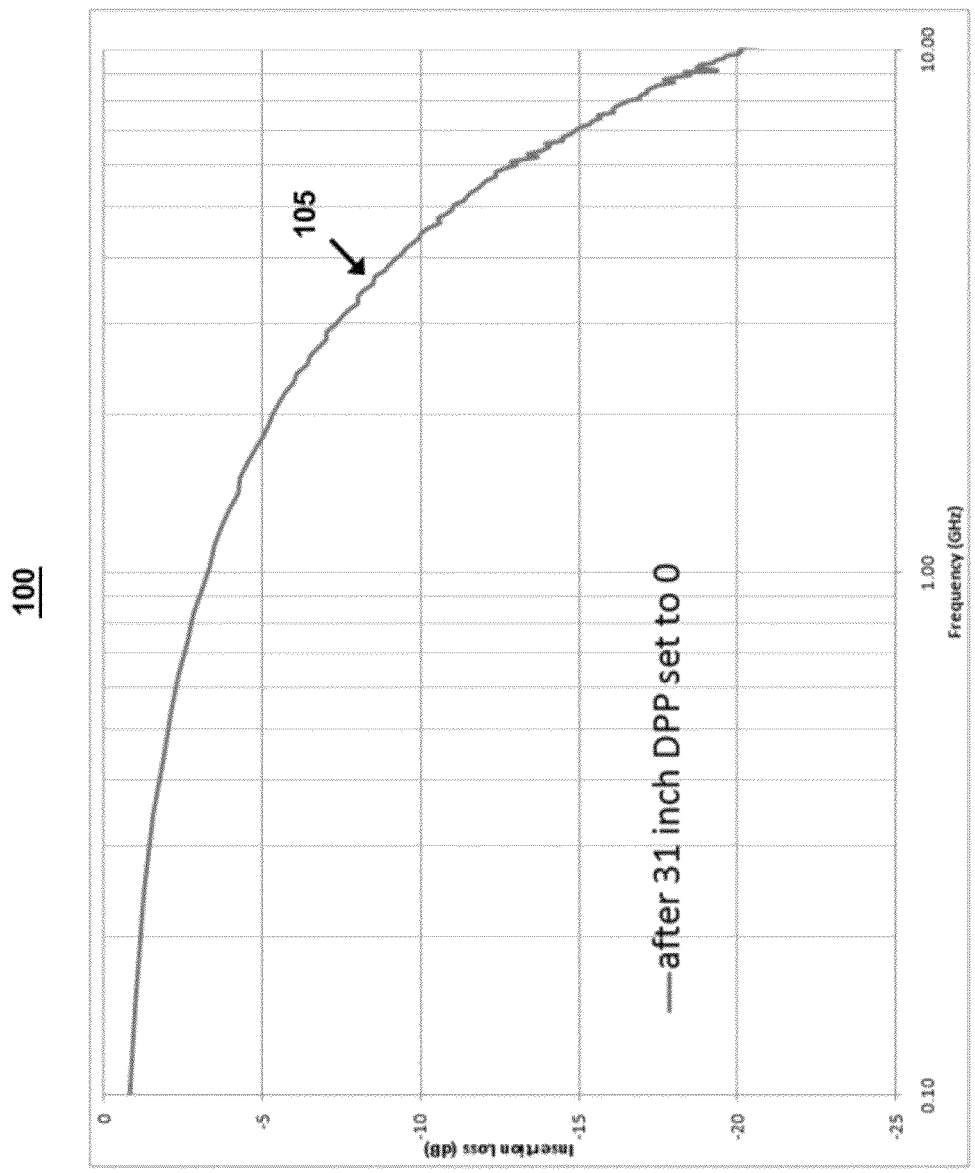
FIG. 1 depicts the insertion loss of a conventional 31" PCB trace.

By way of explanation, consider FIG. 1, which depicts the insertion loss (or frequency response) 105 of a conventional 31" PCB trace. A PCB trace is essentially a low-pass filter because it attenuates higher frequency signals. It causes fast edges of a serial digital communication signal to slow-down, which closes down the region where bit decisions can be made.

Figure 2:
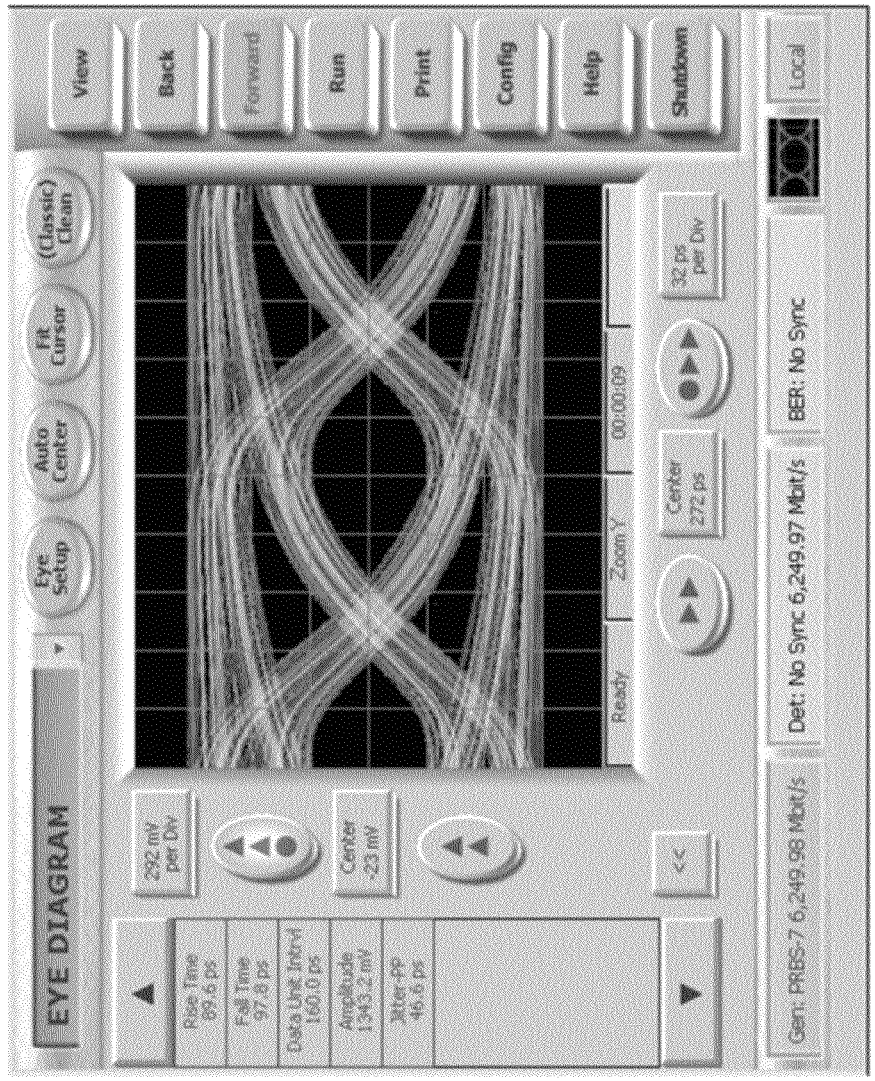
FIG. 2 depicts an eye diagram of a data signal after passing through the 31" PCB trace of FIG. 1.

FIG. 2 depicts an eye diagram 200 of a data signal after passing through the 31" PCB trace of FIG. 1. An eye diagram is a re-traced voltage-versus-time display that is triggered to re-trace on exact data bit boundaries. This shows all of the possible voltages that exist in and around a data bit when synchronized to the bit rate. The open area in the middle of the eye diagram represents the region where correct bit decisions can be made. It is evident from FIG. 2 that the eye opening has been compromised by adding the ISI of a 31" trace.

Figure 3:
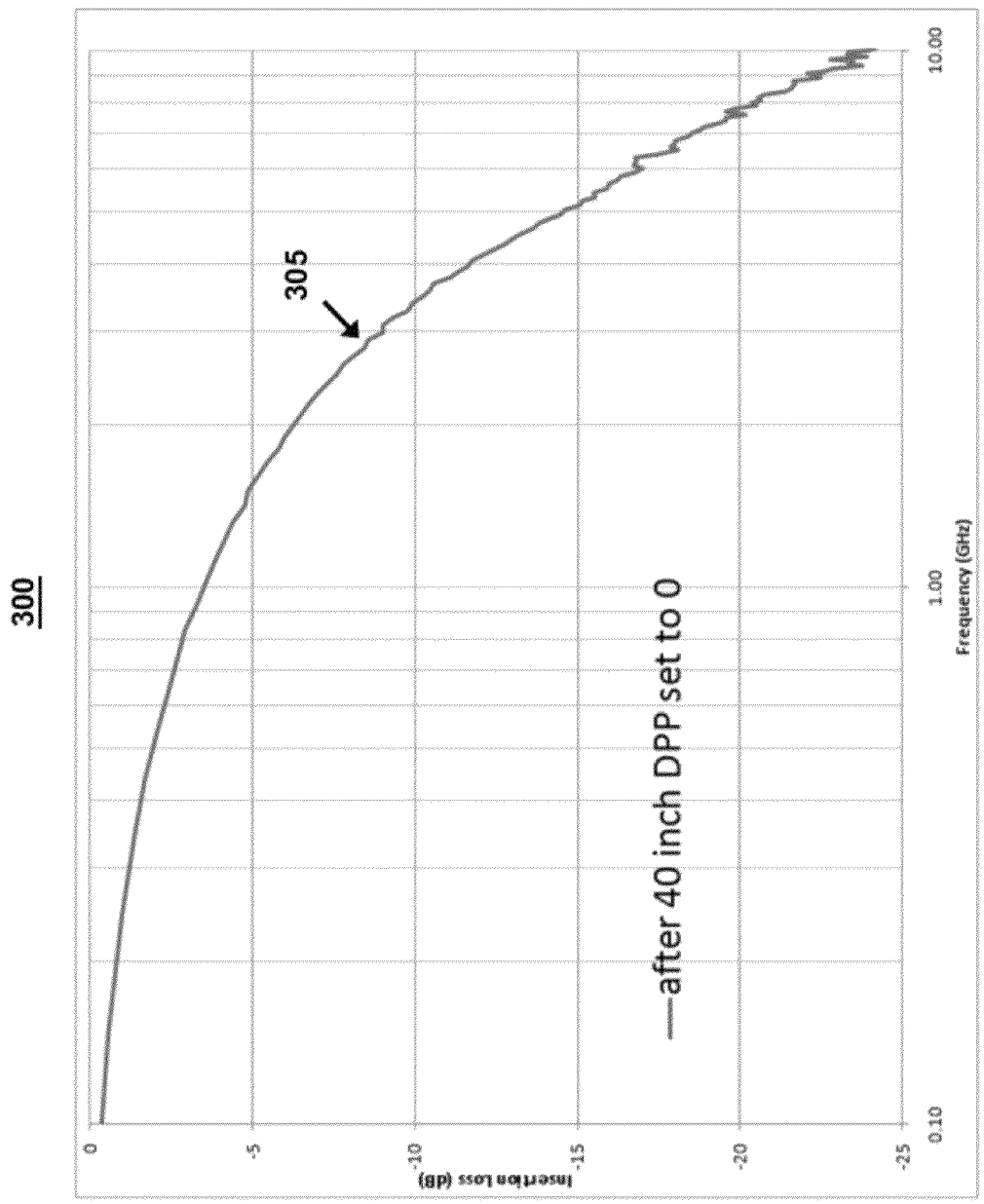
FIG. 3 depicts the insertion loss of a conventional 40" PCB trace.

FIG. 3 depicts the insertion loss 305 of a conventional 40" PCB trace. As expected, this 40" PCB trace exhibits more loss than the 31" PCB trace of FIG. 1.

Figure 4:
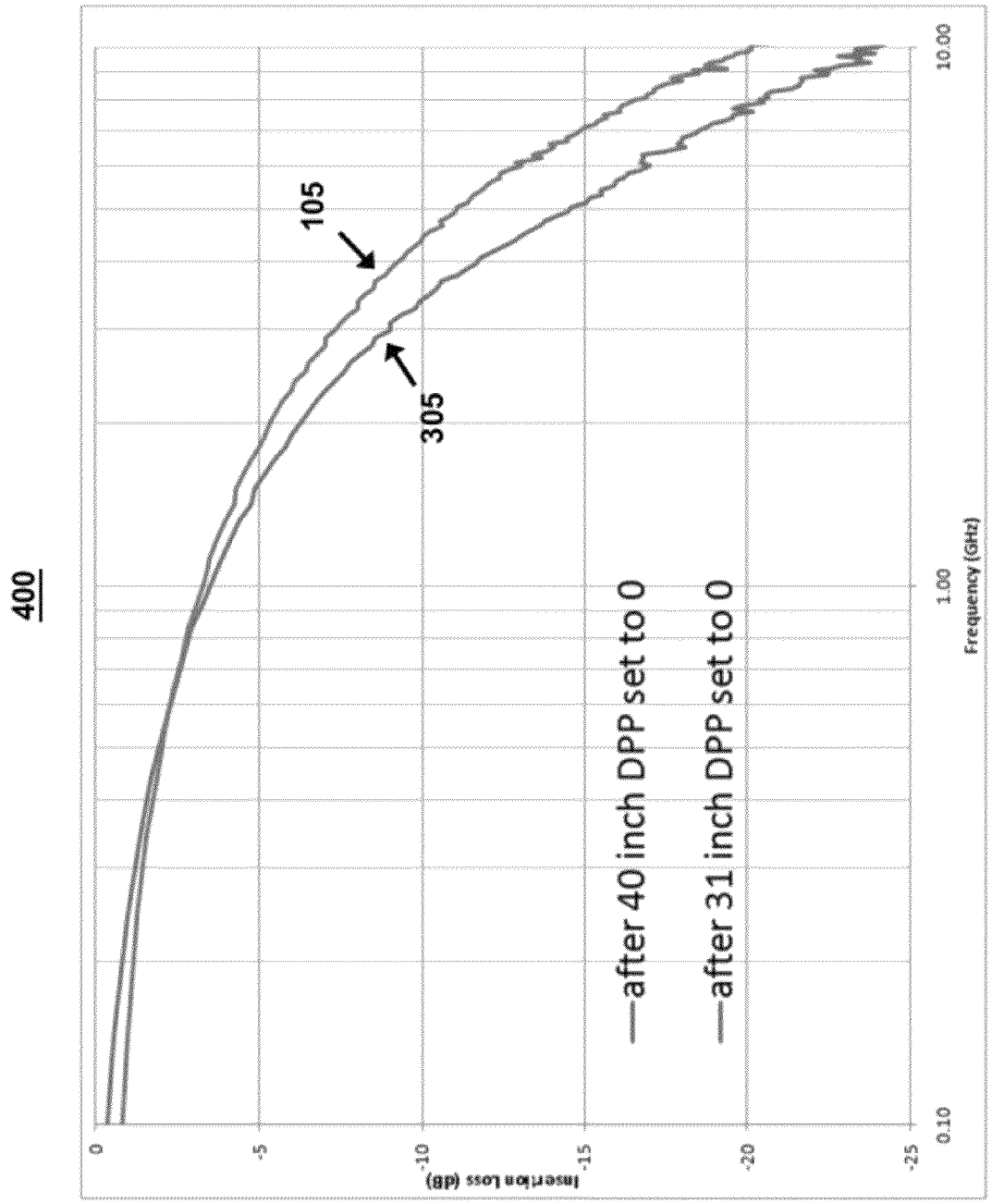
FIG. 4 depicts the insertion loss of the 31" PCB trace of FIG. 1 and the insertion loss of the 40" PCB trace of FIG. 3 on the same graph for comparison.

FIG. 4 depicts the insertion loss of the traces of FIG. 1 and FIG. 3 on the same graph for comparison.

Figure 5:
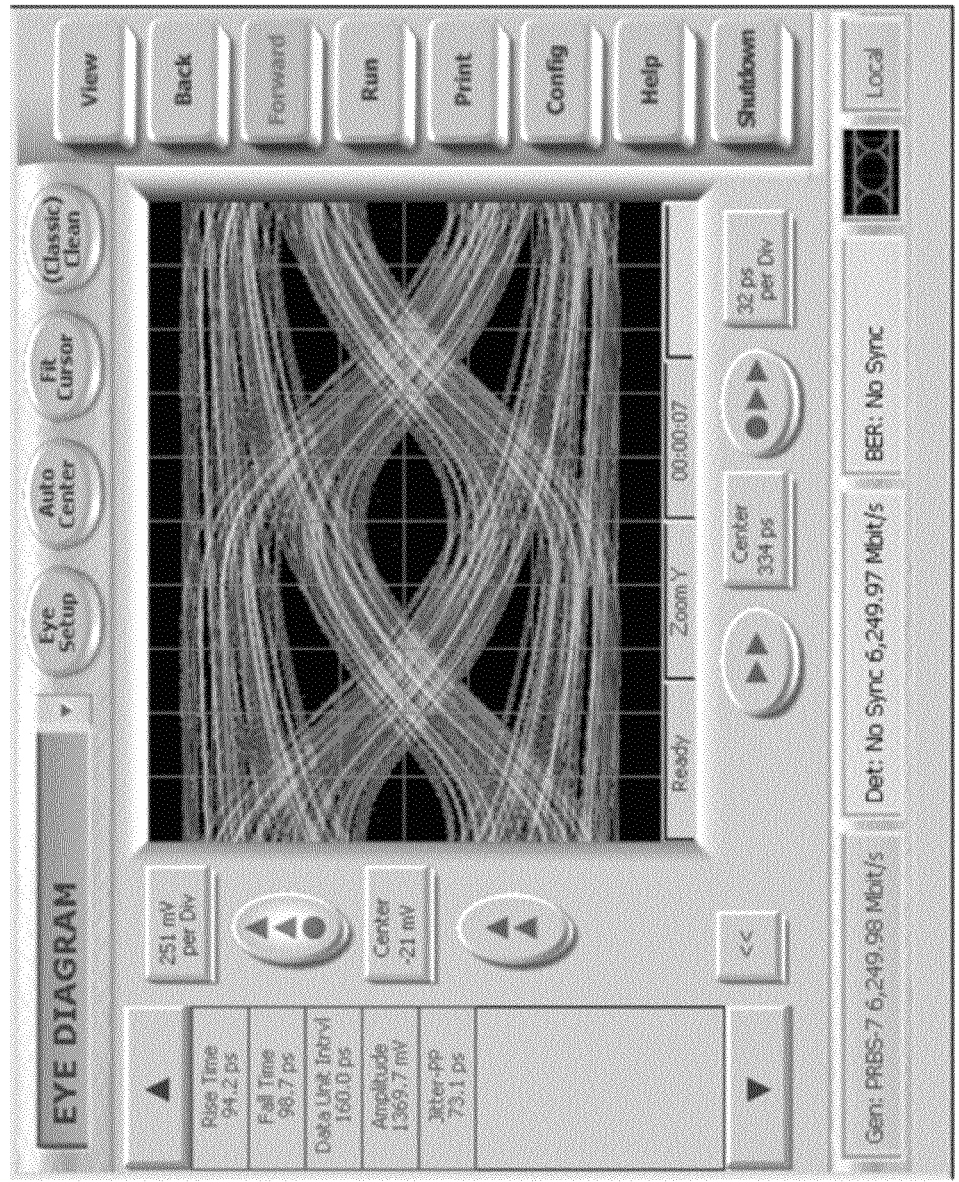
FIG. 5 depicts an eye diagram of a data signal after passing through the 40" PCB trace of FIG. 3.

FIG. 5 depicts an eye diagram 500 of a data signal after passing through the 40" PCB trace of FIG. 3. The loss is greater for the 40" PCB trace than the 31" trace, and thus the ISI is greater as well. This causes the eye diagram of FIG. 5 to be even more compromised than the eye diagram of FIG. 2. That is, the open area of the eye diagram of FIG. 5 is smaller than the open area of the eye diagram of FIG. 2.

Now, an emphasis filter is any device that conditions a data signal by adding controllable amounts of emphasis such as the BERTScope® Digital Pre-emphasis Processor DPP Series available from Tektronix, Inc. of Beaverton, Oreg.

Figure 6:
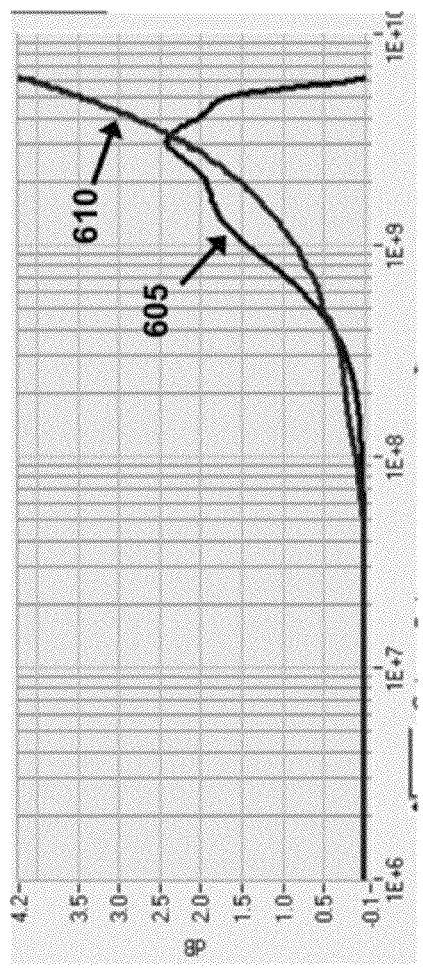
FIG. 6 depicts the frequency response of an emphasis filter, optimized to counteract the insertion loss of a 9" PCB trace, and the loss of a 9" PCB trace.

FIG. 6 depicts the insertion gain (or emphasis) 605 of an emphasis filter, where the parameters (also referred to as taps or coefficients) of the emphasis filter are optimized to approximate the gain needed to counteract the loss 610 of a 9"

PCB trace. 9" is used in this example because 9" is the difference between the two traces shown in FIG. 4 (i.e., 40"−31"=9"). In this example, the emphasis filter is a 4-tap finite impulse response (FIR) filter with taps spaced at the bit interval, however it will be appreciated that the emphasis filter may be an infinite impulse response (IIR) filter, may use other numbers of taps or tap spacing, or may even be an analog circuit having adjustable circuit elements.

Figure 7:
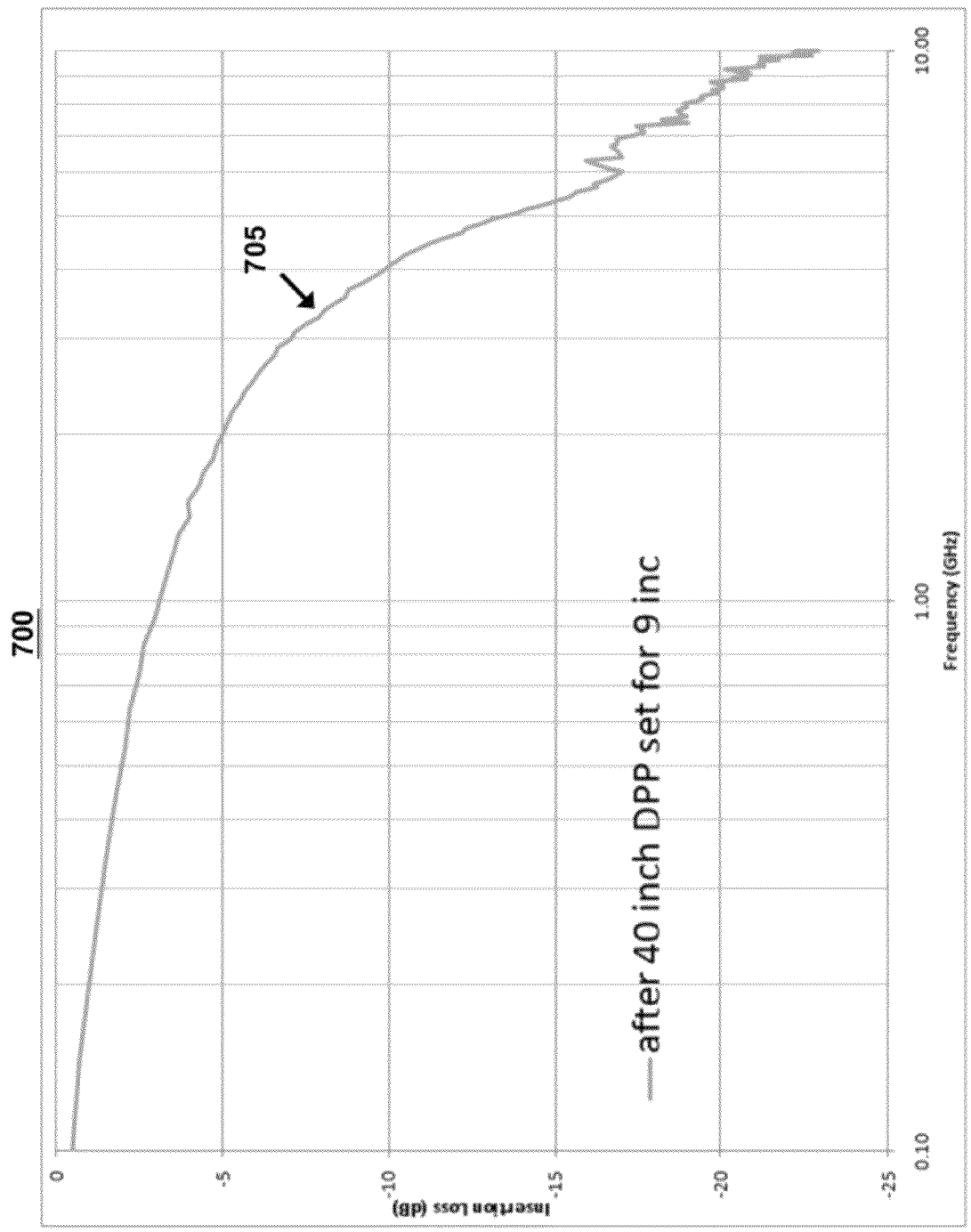
FIG. 7 depicts the insertion loss of a synthesized 31" PCB trace according to an embodiment of the present invention.

Now, in accordance with an embodiment of the present invention, the insertion gain of the 9" emphasis filter 605 is added to the insertion loss of the 40" PCB trace 305 to "synthesize" the frequency response of a 31" PCB trace 705 as shown in FIG. 7.

Figure 8:
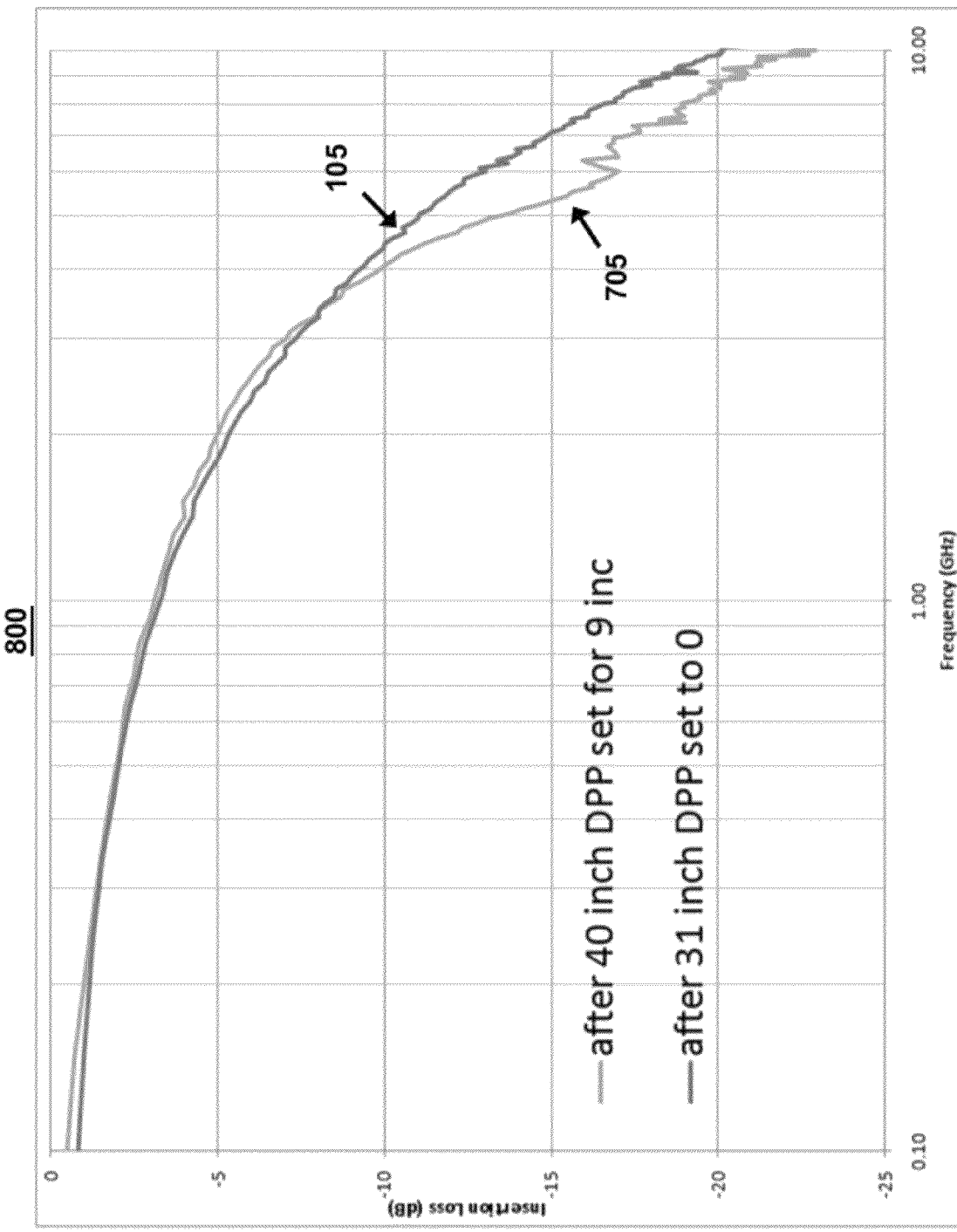
FIG. 8 depicts the insertion loss of the real 31" PCB trace of FIG. 1 and the insertion loss of the synthesized 31" PCB trace FIG. 7 on the same graph for comparison.

FIG. 8 depicts the frequency response of the synthesized 31" PCB trace 705 of FIG. 7 and the frequency response of the real 31" PCB trace 105 of FIG. 1 on the same graph for comparison. The synthesized frequency response 705 matches the real frequency response 105 very closely from low frequency out to several GHz. Note that very good frequency response matching at very high frequencies may not be necessary, because there is typically not much signal energy present at very high frequencies after the attenuation of cables and traces.

Figure 9:
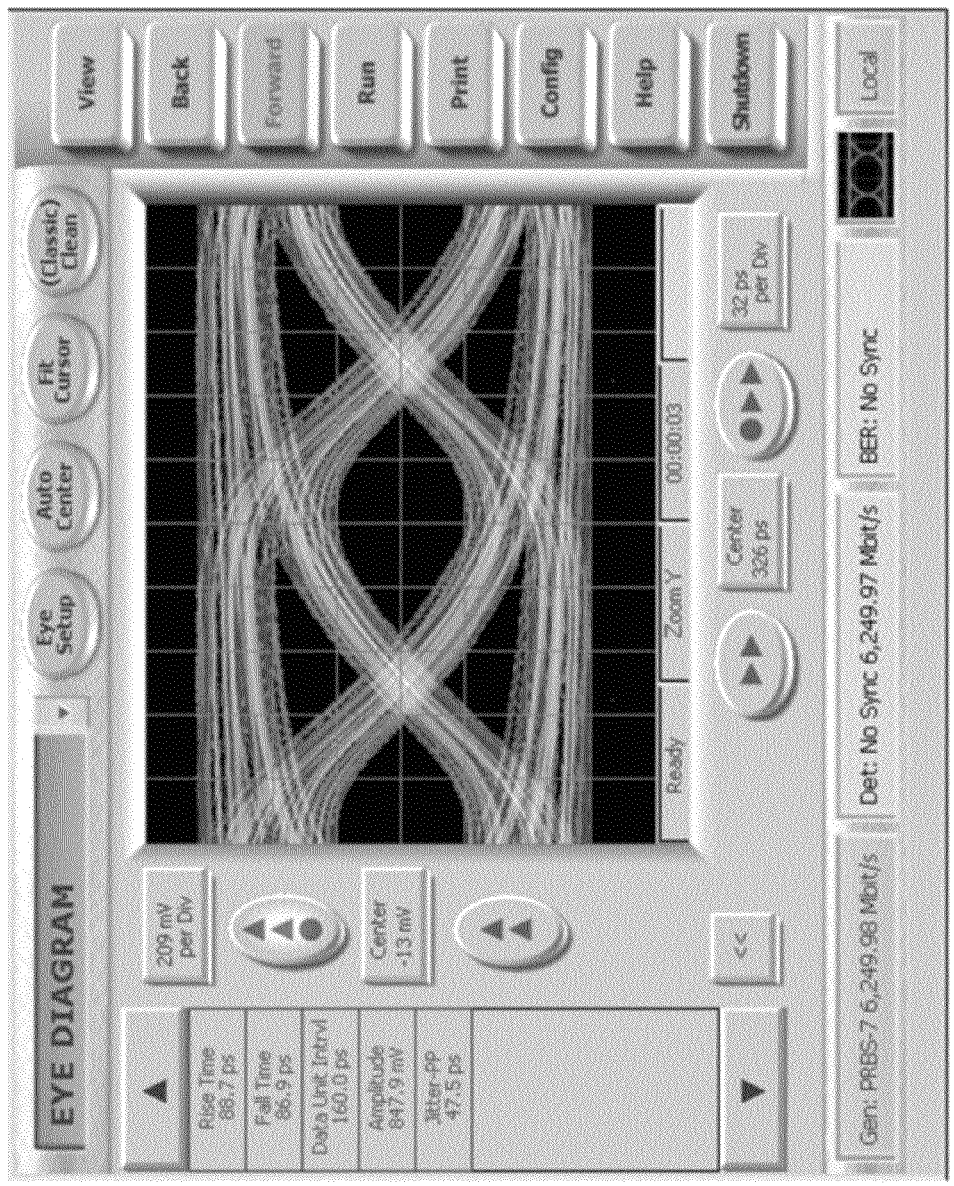
FIG. 9 depicts an eye diagram of a data signal after passing through the synthesized 31" PCB trace of FIG. 7.

FIG. 9 depicts an eye diagram 900 of a data signal after passing through the synthesized 31" PCB trace 705 of FIG. 7. Note that the eye diagram of FIG. 9 closely approximates the eye diagram of FIG. 2, which indicates that the performance of the synthesized 31" PCB trace closely matches the performance of the real 31" PCB trace.

By adjusting the parameters and therefore the insertion gain of the emphasis filter, a large range of continuously variable and finely-tunable ISI amounts can be easily generated. For example, PCB traces having lengths of 32", 33", and 34" can be synthesized by concatenating a 40" PCB trace with an emphasis filter having parameters optimized to approximate the gain needed to counteract the loss of an 8", 7", and 6" PCB trace, respectively. This is a significant improvement over state-of-the-art signal generators which require manual cabling changes and/or large and expensive RF switching arrays to accomplish the same task.

Figure 10:
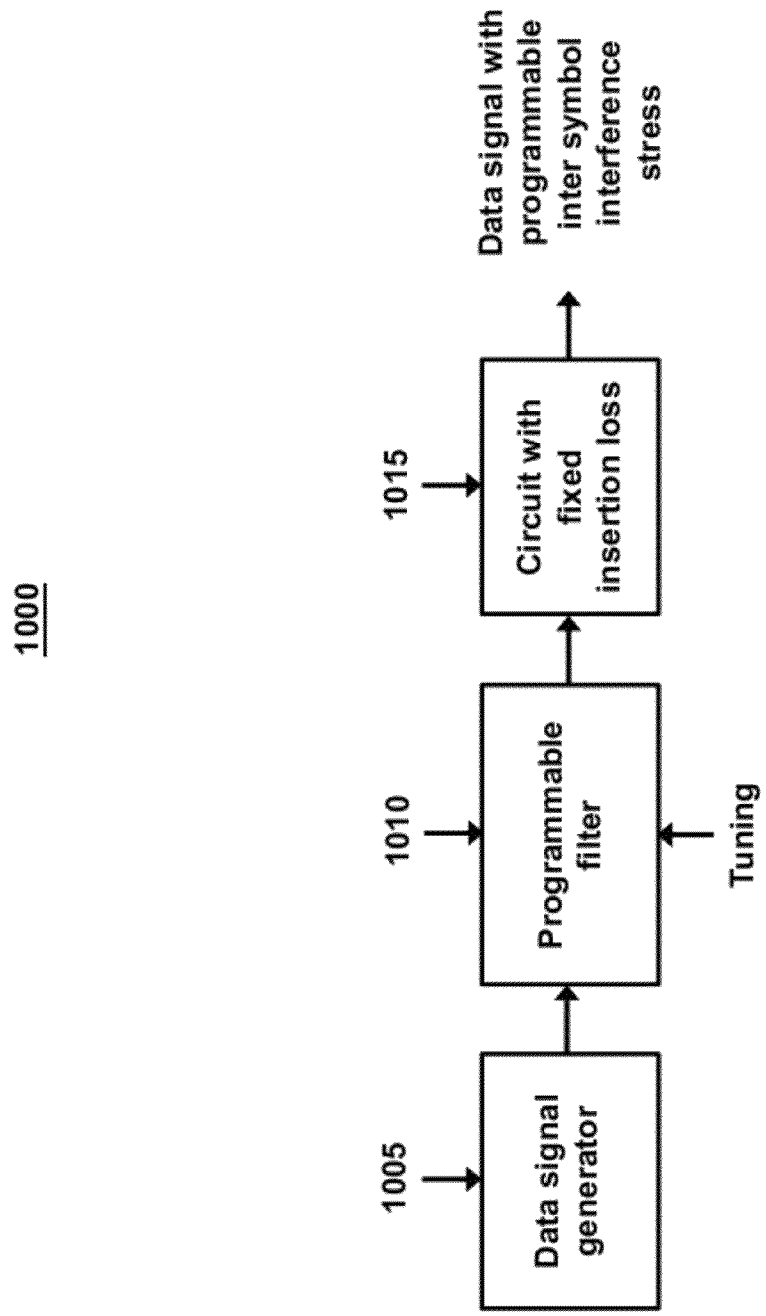
FIG. 10 depicts a high-level block diagram of a variable inter symbol interference generator according to an embodiment of the present invention.

FIG. 10 depicts a variable ISI generator 1000 according to an embodiment of the present invention. A data signal generator 1005 produces a data signal. A programmable filter 1010 receives the data signal and filters it to produce an intermediate signal. In this embodiment, the programmable filter 1010 is an emphasis filter that provides a programmable amount of emphasis in response to a tuning signal. A fixed filter 1015 having a fixed insertion loss such as a PCB trace, a length of cable, a discrete filter, or the like receives the intermediate signal and filters it to produce an output signal. The overall ISI stress impairment of the output signal is the concatenation of the adjustable insertion gain of the programmable filter 1010 and the fixed insertion loss of the fixed filter 1015.

In the embodiment described above, the programmable filter 1010 is an emphasis filter that provides an adjustable amount of insertion gain to improve (i.e., boost) the frequency response of the data signal, so that the combined frequency response of the programmable filter 1010 and the fixed filter 1015 provides for less ISI than the fixed filter 1015 alone. In other embodiments, the programmable filter 1010 is a de-emphasis filter that provides an adjustable amount of insertion loss to degrade the frequency response of the data signal, so that the combined frequency response of the programmable filter 1010 and the fixed filter 1015 provides for more ISI than the fixed filter 1015 alone.

Figure 11:
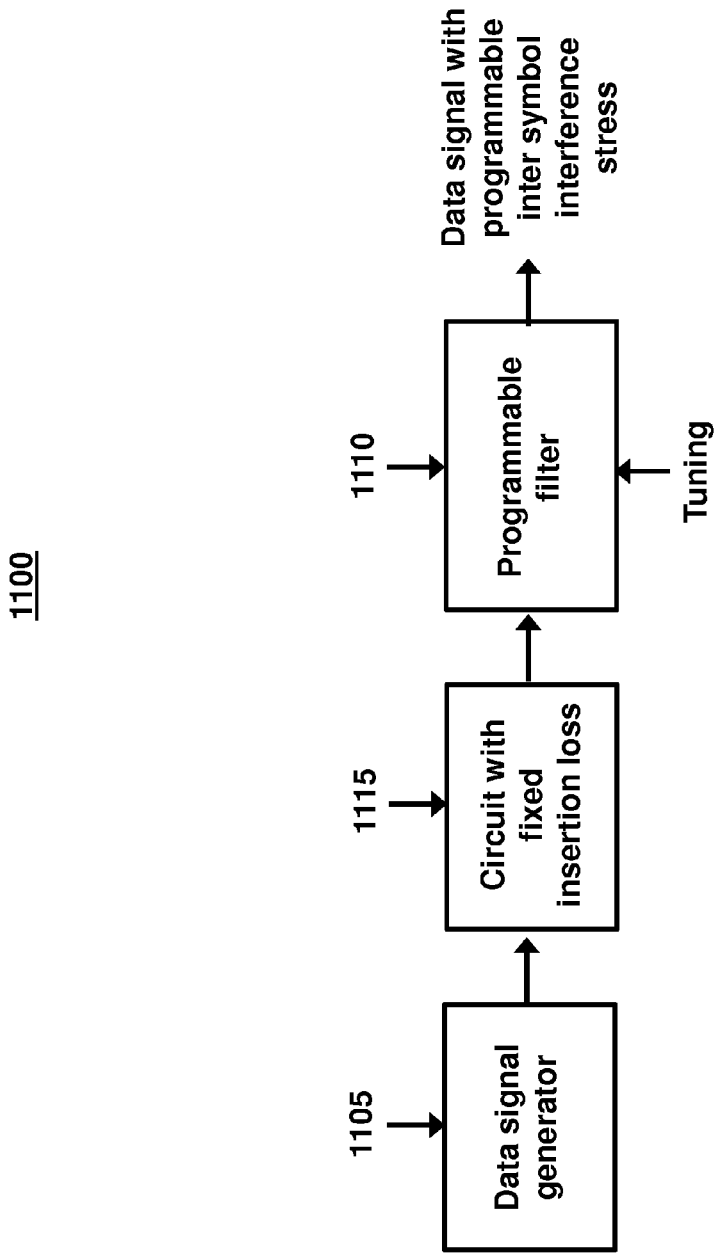
FIG. 11 depicts a high-level block diagram of a variable inter symbol interference generator according to another embodiment of the present invention.

In an alternative embodiment as shown in FIG. 11, an output of a data signal generator 1105 is first input to a fixed filter 1115 having a fixed insertion loss, and then input to a programmable filter 1110 to provide an equivalent result.

It will be appreciated from the foregoing discussion that the present invention represents a significant advance in the field of test and measurement instruments. Although specific embodiments of the invention have been illustrated and described for purposes of illustration, it will be understood that various modifications may be made without departing from the spirit and scope of the invention. Accordingly, the invention should not be limited except as by the appended claims.

What is claimed is:

1. A variable inter symbol interference generator comprising:
   a data signal generator that produces a data signal;
   a programmable filter that receives the data signal and filters the data signal to produce an intermediate signal; and
   a discrete, physically fixed filter having a fixed insertion loss that receives the intermediate signal from the programmable filter and filters the intermediate signal to produce an output signal;
   wherein the programmable filter filters the data signal such that the output signal has a user-specified amount of inter symbol interference stress to synthesize a frequency response of a fixed filter that is different from the discrete, physically fixed filter.

2. The variable inter symbol interference generator as in claim 1 wherein the programmable filter is an emphasis filter that boosts the frequency response of the data signal.

3. The variable inter symbol interference generator as in claim 1 wherein the programmable filter is a de-emphasis filter that degrades the frequency response of the data signal.

4. The variable inter symbol interference generator of claim 1 in which the physically fixed filter is a PCB trace.

5. The variable inter symbol interference generator of claim 1 in which the physically fixed filter is a length of cable.

6. A variable inter symbol interference generator comprising:
   a data signal generator that produces a data signal;
   a physically fixed filter having a fixed insertion loss that receives the data signal and filters the data signal to produce an intermediate signal; and
   a programmable filter that receives the intermediate signal and filters the intermediate signal to produce an output signal;
   wherein the programmable filter filters the intermediate signal such that the output signal has a user-specified amount of inter symbol interference stress to synthesize a frequency response of a fixed filter that is different from the physically fixed filter.

7. The variable inter symbol interference generator as in claim 6 wherein the programmable filter is an emphasis filter that boosts the frequency response of the intermediate signal.

8. The variable inter symbol interference generator as in claim 6 wherein the programmable filter is a de-emphasis filter that degrades the frequency response of the intermediate signal.

9. The variable inter symbol interference generator of claim 6 in which the physically fixed filter is a PCB trace.

10. The variable inter symbol interference generator of claim 6 in which the physically fixed filter is a length of cable.

11. A method of generating a data signal having a user-specified amount of inter symbol interference comprising the steps of:

producing a data signal;

filtering the data signal with a programmable filter to produce an intermediate signal; and filtering the intermediate signal with a physically fixed filter having a fixed insertion loss to produce an output signal;

wherein the programmable filter filters the data signal such that the output signal has a user-specified amount of inter symbol interference stress to synthesize a frequency response of a fixed filter that is different from the physically fixed filter.

12. The method as in claim 11 wherein the programmable filter is an emphasis filter that boosts the frequency response of the data signal.

13. The method as in claim 11 wherein the programmable filter is a de-emphasis filter that degrades the frequency response of the data signal.

14. The method of generating a data signal having a user-specified amount of inter symbol interference according to claim 11 in which filtering the intermediate signal with the physically fixed filter comprises passing the intermediate signal through a physical PCB trace.

15. The method of generating a data signal having a user-specified amount of inter symbol interference according to claim 11 in which filtering the intermediate signal with the physically fixed filter comprises passing the intermediate signal through a length of cable.

16. The method of generating a data signal having a user-specified amount of inter symbol interference according to claim 11 in which filtering the intermediate signal with the physically fixed filter comprises passing the intermediate signal through a physical, discrete filter.

17. The method of generating a data signal having a user-specified amount of inter symbol interference according to claim 11 in which filtering the data signal with the physically fixed filter having a fixed insertion loss comprises passing the intermediate signal through a physical PCB trace.

18. The method of generating a data signal having a user-specified amount of inter symbol interference according to claim 11 in which filtering the data signal with the physically fixed filter having a fixed insertion loss comprises passing the intermediate signal through a physical length of cable.

19. A method of generating a data signal having a user-specified amount of inter symbol interference comprising the steps of:

producing a data signal;

filtering the data signal with a physically fixed filter having a fixed insertion loss to produce an intermediate signal; and filtering the intermediate signal with a programmable filter to produce an output signal;

wherein the programmable filter filters the intermediate signal such that the output signal has a user-specified amount of inter symbol interference stress to synthesize a frequency response of a fixed filter that is different from the physically fixed filter.

20. The method as in claim 19 wherein the programmable filter is an emphasis filter that boosts the frequency response of the intermediate signal.

21. The method as in claim 19 wherein the programmable filter is a de-emphasis filter that degrades the frequency response of the intermediate signal.

22. A variable inter symbol interference generator comprising:

a data signal generator that produces a data signal;

a programmable filter that receives the data signal and filters the data signal to produce a user-specified amount of inter-symbol interference stress on an intermediate signal; and a PCB trace coupled to an output of the programmable filter, the PCB trace having a fixed insertion loss and structured to receive the intermediate signal from the programmable filter and filter the intermediate signal to produce an output signal that synthesizes a frequency response of a PCB trace that is different from the PCB trace coupled to the output of the programmable filter.

23. A variable inter symbol interference generator comprising:

a data signal generator that produces a data signal;

a programmable filter that receives the data signal and filters the data signal to produce a user-specified amount of inter-symbol interference stress on an intermediate signal; and a physical length of electrical cable coupled to an output of the programmable filter, the electrical cable having a fixed insertion loss and structured to receive the intermediate signal from the programmable filter and filter the intermediate signal to produce an output signal that synthesizes a frequency response of a physical length of electrical cable that is a different length from the physical length of electrical cable coupled to the output of the programmable filter.

* * * * *